US012707568B2

(12) United States Patent
Wu et al.

(10) Patent No.: US 12,707,568 B2
(45) Date of Patent: Aug. 11, 2026

(54) LIGHT-EMITTING IMAGE SENSING MODULE AND METHOD FOR FABRICATING THE SAME

(71) Applicant: Medimaging Integrated Solution, Inc., Hsinchu (TW)

(72) Inventors: Shangyi Wu, Hsinchu (TW); Yi-Han Huang, Hsinchu (TW); Jia-De Zhou, Hsinchu (TW)

(73) Assignee: MEDIMAGING INTEGRATED SOLUTION, INC., Hsinchu (TW)

( * ) Notice: Subject to any disclaimer, the term of this patent is extended or adjusted under 35 U.S.C. 154(b) by 265 days.

(21) Appl. No.: 18/479,920

(22) Filed: Oct. 3, 2023

(65) Prior Publication Data

US 2024/0130045 A1 Apr. 18, 2024

(30) Foreign Application Priority Data

Oct. 14, 2022 (TW) ................................. 111139151

(51) Int. Cl.

| | |
|---|---|
| ***H05K 1/18*** | (2026.01) |
| ***G02B 23/24*** | (2006.01) |
| ***H05K 1/02*** | (2006.01) |
| ***H05K 3/00*** | (2006.01) |
| ***H05K 3/28*** | (2006.01) |

(52) U.S. Cl.

CPC ............. *H05K 1/18* (2013.01); *H05K 1/0274* (2013.01); *H05K 3/0044* (2013.01); *H05K 3/28* (2013.01); *G02B 23/2484* (2013.01); *H05K 2201/09072* (2013.01); *H05K 2201/10106* (2013.01); *H05K 2201/10121* (2013.01); *H05K 2201/10151* (2013.01); *H05K 2201/10734* (2013.01); *H05K 2203/0228* (2013.01)

(58) Field of Classification Search

None

See application file for complete search history.

(56) References Cited

U.S. PATENT DOCUMENTS

| | | | | |
|---|---|---|---|---|
| 2006/0038197 A1* | 2/2006 | Wang | .................. | H10H 20/856 257/E33.072 |
| 2019/0029494 A1* | 1/2019 | Araki | .................. | A61B 1/0008 |

* cited by examiner

*Primary Examiner* — Timothy J Thompson
*Assistant Examiner* — John B Freal
(74) *Attorney, Agent, or Firm* — MUNCY, GEISSLER, OLDS & LOWE, P.C.

(57) ABSTRACT

The invention provides a light-emitting image sensing module and a method for fabricating the same. The light-emitting image sensing module includes a circuit board, an image sensor, conductive carriers, light sources, an opaque lens barrel, and a lens module. The image sensor and the conductive carriers are arranged on the circuit board. The light sources are arranged on the conductive carrier. The opaque lens barrel is penetrated by a first hole and a second hole and arranged on the circuit board. The first hole sleeves the image sensor, and the second hole sleeves the conductive carriers and the light sources. The lens module is fixed in the first hole and arranged above the image sensor. The invention uses the circuit board to carry out the packaging process of the image sensor and the light source, so as to achieve the economic benefit.

13 Claims, 13 Drawing Sheets

LIGHT-EMITTING IMAGE SENSING MODULE AND METHOD FOR FABRICATING THE SAME

BACKGROUND OF THE INVENTION

1. Field of the Invention

The present invention relates to a sensing technology, particularly to a light-emitting image sensing module and a method for fabricating the same.

2. Description of the Prior Art

The existing method for fabricating a conventional light-emitting image sensing module includes steps: soldering a CMOS Image Sensor Module (CIS Module), light-emitting modules (LEDs), and transmission wires to a printed circuit board (PCB) or a flexible printed circuit board (FPC); bending the planar PCB or FPC to a preset angle; or performing soldering and assembling two pieces of PCB or FPC into the required structure. Then, the following methods are further used to secure the structure:

1. Required electronic elements (such as passive elements and capacitors) and wires (such as image transmission lines and power lines) are soldered to PCB or FPC. The shape of the entire FPC module is formed in a plastic mold-injection technology, such as the insert molding technology or the over molding technology. Alternatively, a hollow pipe is used to sleeve the PCB or FPC where wires have been soldered, and the pipe is filled with resin to fix the elements inside the pipe and obtain the completed module.
2. An image sensor and LEDs are placed on a carrier plate. The required wires are connected to the through-holes of a connector on the rear side to transmit image signals.
3. An image sensor and a LED are placed on a carrier plate beforehand. The carrier plate having the sensor and LED is placed inside a specially designed pipe, wherein the pipe is opaque and a barrier is interposed between the image sensor and LED to block light from entering the image sensor, and wherein the center of the barrier has an opening allowing imaging light to enter the sensor. A light-reflecting material is coated on the barrier and the sidewall of the pipe, and a light-conduction material is filled between the barrier and the pipe to guide the light source out of the region.
4. The abovementioned CIS module, which contains a sensor and a lens, is fabricated in a chip scale package (CSP) technology. The CIS module is small in size and hard to fabricate, having lower yield and higher price. If the CIS module is alternatively integrated with LED, it will lead to a larger volume.
5. The upper halves of two sides of a barrel containing lenses are cut to form a step. Next, an FPC with a LED light source is bent, placed on the step, and fixed to the step. Then, a modularized method is used to fix the FPC and the barrel to form an image and optics module.

Since the lens has been integrated in the CIS module, the optical specification of the lens (such as the angular field of view and the depth of field) would be unlikely to vary. Such a problem makes the CIS module unable to satisfy the requirement of endoscopes. If the CIS module is redesigned to vary the optical specification, the cost will be much higher than a traditional lens. If an image sensor is assembled to a home-produced traditional round lens barrel, the outer diameter of the finished product will be much larger than the outer diameter of a module fabricated in a chip scale package technology. After a LED light source is further added to the abovementioned module using the round lens barrel, the size thereof will be too large to be used by a small-size endoscope. If FPC is arranged on the lateral of the lens barrel and bent to make LED face upward, FPC will be at least bent once, and the circuits of FPC may be damaged. Further, the bent FPC is hard to be assembled and attached to the sidewall of the lens barrel. Such a problem makes the size of the endoscope hard to control.

Accordingly, the present invention proposes a light-emitting image sensing module and a method for fabricating the same to overcome the abovementioned problems.

SUMMARY OF THE INVENTION

The present invention provides a light-emitting image sensing module and a method for fabricating the same, which are applicable to smaller endoscopes, able to raise yield, increase process flexibility, and achieve a benefit of economical scale.

In one embodiment, the present invention provides a light-emitting image sensing module, which comprises a circuit board, an image sensor, at least one conductive carrier, at least one light source, an opaque lens barrel, and a lens module. The image sensor is installed on the circuit board and electrically connected with the circuit board. The conductive carrier is installed on the circuit board and electrically connected with the circuit board. The position of the conductive carrier is corresponding to the position of the image sensor. The light source is disposed on the top of the conductive carrier and electrically connected with the conductive carrier. A first hole and at least one second hole penetrate the opaque lens barrel. The positions of the first hole and the second hole are respectively corresponding to the positions of the image sensor and the conductive carrier. The opaque lens barrel is installed on the circuit board. The first hole sleeves the image sensor, and the second hole sleeves the conductive carrier and the light source. The lens module is fixed in the first hole and disposed above the image sensor.

In one embodiment of the present invention, the light-emitting image sensing module further comprises a hollow cylinder, which sleeves the opaque lens barrel, the circuit board, the image sensor, the conductive carrier, the light source, and the lens module.

In one embodiment of the present invention, the light source is a light-emitting diode.

In one embodiment of the present invention, a reflecting film is formed on the inner sidewall of the second hole.

In one embodiment of the present invention, the light-emitting image sensing module further comprises a transparent resin, which is filled into the second hole for covering the conductive carrier and the light source.

In one embodiment of the present invention, the lens module includes at least one lens, at least one spacer, and a transparent cover plate. The lens is assembled in the first hole and disposed above the image sensor. The spacer is fixed in the first hole and disposed on the lens, having through-holes penetrating the spacer. The transparent cover plate is fixed in the first hole and disposed on the spacer.

In one embodiment of the present invention, the circuit board is a ceramic substrate, a printed circuit board, or a flexible printed circuit board.

In one embodiment, the present invention provides a method for fabrication a light-emitting image sensing module, which comprises steps: providing a motherboard having a plurality of groups of cutting holes that penetrate the motherboard; installing a plurality of image sensors on the motherboard and electrically connecting the image sensors with the motherboard, wherein the positions of the plurality of groups of cutting holes are respectively corresponding to the positions of the plurality of image sensors; installing a plurality of conductive carriers on the motherboard and electrically connecting the plurality of conductive carriers with the motherboard, wherein the positions of the conductive carriers are respectively corresponding to the positions of the image sensors; respectively installing a plurality of light sources on the tops of all the conductive carriers and respectively electrically connecting all the light sources with all the conductive carriers; providing a plurality of opaque lens barrels respectively corresponding to all the image sensors, wherein each opaque lens barrel has a first hole and at least one second hole, which penetrate the opaque lens barrel, and wherein the positions of the first hole and the second hole are respectively corresponding to the positions of the image sensor and the conductive carrier, and wherein a lens module is fixed in the first hole of each opaque lens barrel; installing all the opaque lens barrels on the motherboard, using the first holes to sleeve the image sensors, and using the second holes to sleeve the conductive carriers and the light sources, wherein the lens module is disposed above the corresponding image sensor; cutting the motherboard along the plurality of groups of cutting holes to obtain a plurality of light-emitting image sensing modules, wherein each light-emitting image sensing module includes a circuit board, and also includes the image sensor, the conductive carrier, the light source, the lens module and the opaque lens barrel, which are disposed on the circuit board.

In one embodiment of the present invention, the method for fabrication a light-emitting image sensing module comprises a step: using a hollow cylinder to sleeve each circuit board, and also sleeve the opaque lens barrel, the image sensor, the conductive carrier, the light source, and the lens module, which are disposed on the circuit board.

In one embodiment of the present invention, the method for fabrication a light-emitting image sensing module comprises a step: filling a transparent resin into the second hole of each opaque lens barrel to cover the corresponding conductive carrier and light source.

In one embodiment, the present invention provides another method for fabrication a light-emitting image sensing module, which comprises steps: installing an image sensor on a circuit board, and electrically connecting the image sensor with the circuit board; installing at least one conductive carrier on the circuit board, and electrically connecting the conductive carrier with the circuit board; installing at least one light source on the top of the conductive carrier, and electrically connecting the light source with the conductive carrier; providing an opaque lens barrel, wherein the opaque lens barrel has a first hole and at least one second hole, which penetrate the opaque lens barrel, and wherein the positions of the first hole and the second hole are respectively corresponding to the positions of the image sensor and the conductive carrier, and fixing a lens module in the first hole of the opaque lens barrel; and installing the opaque lens barrel on the circuit board, using the first hole to sleeve the image sensor, and using the second hole to sleeve the conductive carrier and the light source, wherein the lens module is disposed above the image sensor.

In one embodiment of the present invention, the method for fabrication a light-emitting image sensing module further comprises a step: using a hollow cylinder to sleeve the opaque lens barrel, the circuit board, the image sensor, the conductive carrier, the light source, and the lens module.

In one embodiment of the present invention, the method for fabrication a light-emitting image sensing module further comprises a step: filling a transparent resin into the second hole to cover the conductive carrier and the light source.

In the light-emitting image sensing module and the method for fabricating the same of the present invention, a circuit board is used in the package to achieve the benefit of economical scale. The relative altitudes of the image sensors and the light sources may be controlled by designing the heights of different conductive carriers. An opaque lens barrel is used to separate the image sensor from the light source lest stray light enter the image sensor. In order to overcome the larger area of the conventional technology wherein the light source is added to the traditional barrel having sleeved the image sensor, the present invention uses the opaque lens barrel to sleeve the image sensor and the light source simultaneously to achieve a smaller area and make the present invention more suitable for smaller-size endoscopes than the conventional technology. In the present invention, Modulation Transfer Function (MTF) inspection equipment is used to control the assemblage quality, guarantee the quality of products and raise the yield of the image sensing modules. Besides, the present invention can arbitrarily vary the combination of the lenses of the lens module to achieve different optical specifications, whereby the present invention has higher fabrication flexibility. In the present invention, the opaque lens barrels may be mass-produced in a mold-injection technology, whereby the present invention enjoys cost advantage and has higher yield and better fabrication flexibility than the fabrication technology of wafer-level lenses.

The objective, technologies, features and advantages of the present invention will become apparent from the following description in conjunction with the accompanying drawings wherein certain embodiments of the present invention are set forth by way of illustration and example.

BRIEF DESCRIPTION OF THE DRAWINGS

The foregoing conceptions and their accompanying advantages of this invention will become more readily appreciated after being better understood by referring to the following detailed description, in conjunction with the accompanying drawings, wherein.

DESCRIPTION OF THE PREFERRED EMBODIMENTS

Figure 1:
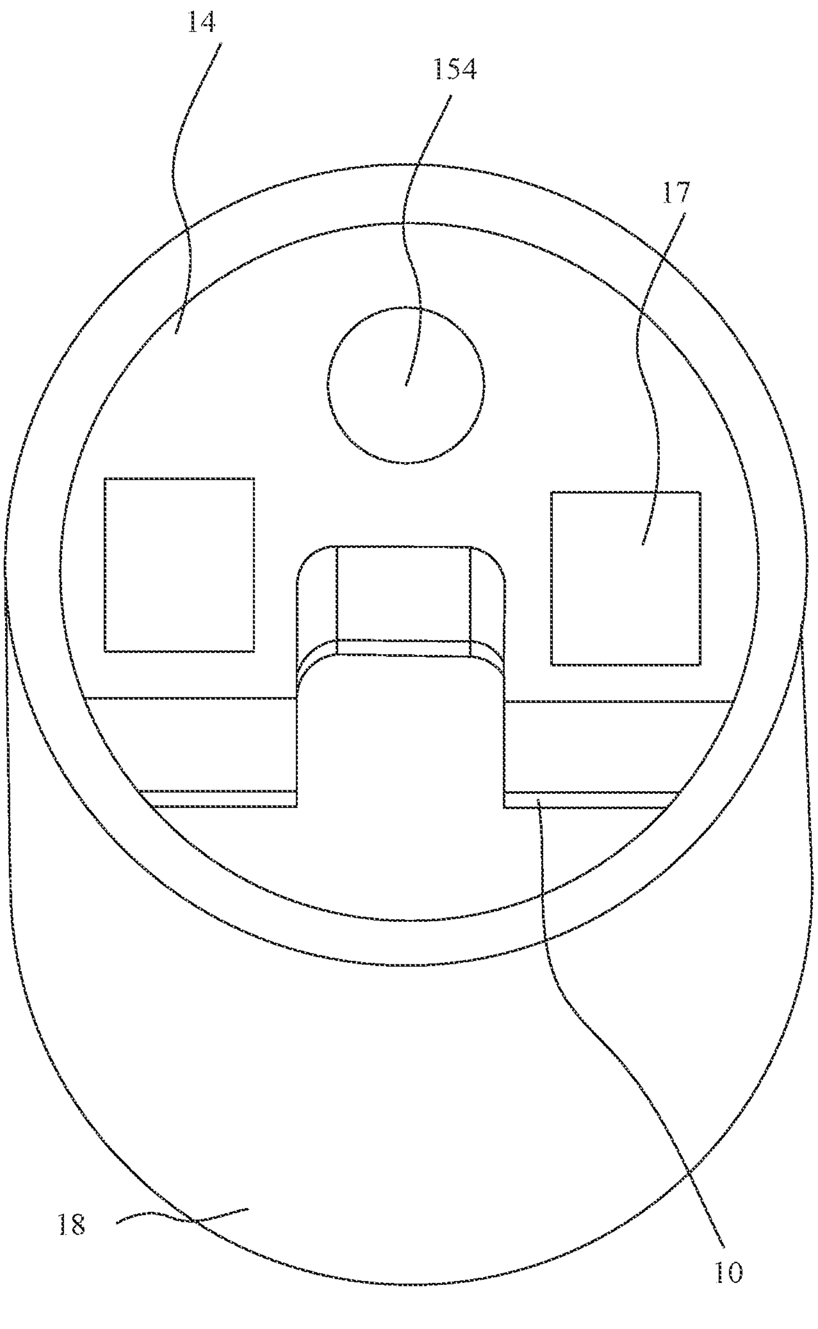
FIG. 1 is a perspective view schematically showing the structure of a light-emitting image sensing module according to one embodiment of the present invention.

Various embodiments of the present invention will be described in detail below and illustrated in conjunction with the accompanying drawings. In addition to these detailed descriptions, the present invention can be widely implemented in other embodiments, and apparent alternations, modifications and equivalent changes of any mentioned embodiments are all included within the scope of the present invention and based on the scope of the claims. In the descriptions of the specification, in order to make readers have a more complete understanding about the present invention, many specific details are provided; however, the present invention may be implemented without parts of or all the specific details. In addition, the well-known steps or elements are not described in detail, in order to avoid unnecessary limitations to the present invention. Same or similar elements in Figures will be indicated by same or similar reference numbers. It is noted that the Figures are schematic and may not represent the actual size or number of the elements. For clearness of the Figures, some details may not be fully depicted.

In the specification, while a first element is disposed above a second element, it may indicate that the first element is directly placed on the second element or may alternatively imply that there is another element interposed between the first element and the second element. While a first element is directly disposed or placed on a second element, it indicates that no other element exists between the first element and the second element. In the specification, the phrase "A, B and/or C" indicates "one of A, B and C", or combinations of one or more listed items (A, B and C)".

In the specification, the description about "one embodiment" indicates that a specified element, structure, or characteristic is involved in at least one embodiment. Therefore, the descriptions about "one embodiment" is not only aimed to an identical embodiment. Further, the elements, structures and characteristics described in one or more embodiments may be recombined according to appropriate ways.

The present invention may be described with embodiments. However, it should be understood: those embodiments are only to exemplify the present invention but not to limit the scope of the present invention. Any modification or variation according to the spirit or characteristics of the present invention is to be included by the scope of the present invention. In the specification and claims, "a" or "the" means "one or at least one" described item except the text states it differently. In the specification and claims, the statement of the item described by a singular article also involves the same statement of a plurality of the same items except the plural condition is obviously excluded hereinbefore or thereinafter. In the specification and claims, "in" may imply "in" and "on" except the text states it differently. In the specification and claims, a term normally has an ordinary meaning known by the persons skilled in the art except the text states it differently. Some terms used by the specification and claims will be further discussed thereinafter for the reference of the practitioners.

In the specification and claims, "electrically coupled to" or "electrically connected with" indicates any direct or indirect electrical connection. For example, "a first device is electrically coupled to a second device" implies "the first device is directly connected with the second device or indirectly connected with the second device through another device or another connection measure". About the transmission of electrical signals, it should be understood by the persons skilled in the art: electrical signals would decay or vary more or less during transmission. However, the electrical signals at the source side and the electrical signals at the recipient side would be regarded as substantially the same. For example, Point A of an electronic circuit transmits or supplies an electrical signal S to Point B; the electrical signal S may pass through a source and a drain of a transistor switch and/or a parasitic capacitor during transmission and thus suffer voltage drop more or less. The electrical signals S at Point A and the electrical signals at Point B would be regarded as substantially the same unless the transmission-induced attenuation or variation is intentionally generated to achieve a special technical effect.

Some conditional clauses or words, such as "can", "could", "might" and "may", are normally intended to express that the embodiment has characteristics, elements, or steps, which may be unnecessary in other embodiments, unless the text explain it particularly.

It should be understood: "comprise", "include", "have", "contain", "involve", etc. are open-ended. In other words, the statement: an object "comprises", "includes", "has", "contains", or "involves" some items does not exclude that the object further "comprises", "includes", "has", "contains", or "involves" other items. It should be also understood: it is unnecessary for the embodiment of the present invention to achieve all the objectives or advantages disclosed by the present invention. Besides, the abstract and the title are only to assist the readers in searching patent documents but not to limit the scope of the present invention.

Below is introduced a light-emitting image sensing module and a method for fabricating the same of the present invention, which use a circuit board in the package of image sensors and light sources to achieve the benefit of economical scale. The relative altitudes of the image sensors and the light sources may be controlled by designing the heights of different conductive carriers. An opaque lens barrel is used to separate the image sensor from the light source lest stray light enter the image sensor. In order to overcome the larger area of the conventional technology wherein the light source is added to the traditional lens barrel having sleeved the image sensor, the present invention uses the opaque lens barrel to sleeve the image sensor and the light source simultaneously to achieve a smaller area and make the present invention more suitable for smaller-size endoscopes than the conventional technology. In the present invention, Modulation Transfer Function (MTF) inspection equipment is used to control the assemblage quality, guarantee the quality of products and raise the yield of the image sensing modules. Besides, the present invention can arbitrarily vary the combination of the lenses of the lens module to achieve different optical specifications, whereby the present invention has higher fabrication flexibility. In the present invention, the opaque lens barrels may be mass-produced in a mold-injection technology, whereby the present invention enjoys cost advantage and has higher yield and better fabrication flexibility than the fabrication of wafer-level lenses.

Figure 2:
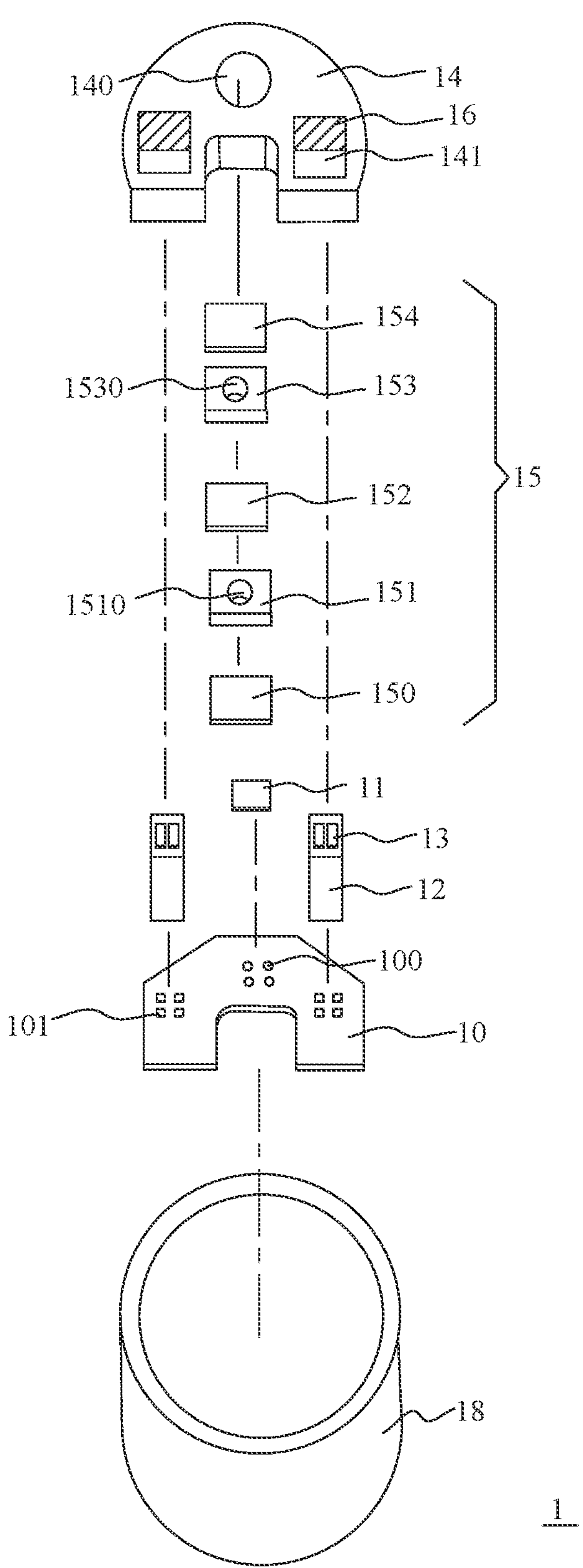
FIG. 2 is an exploded view schematically showing the structure of a light-emitting image sensing module according to one embodiment of the present invention.
Figure 3A:
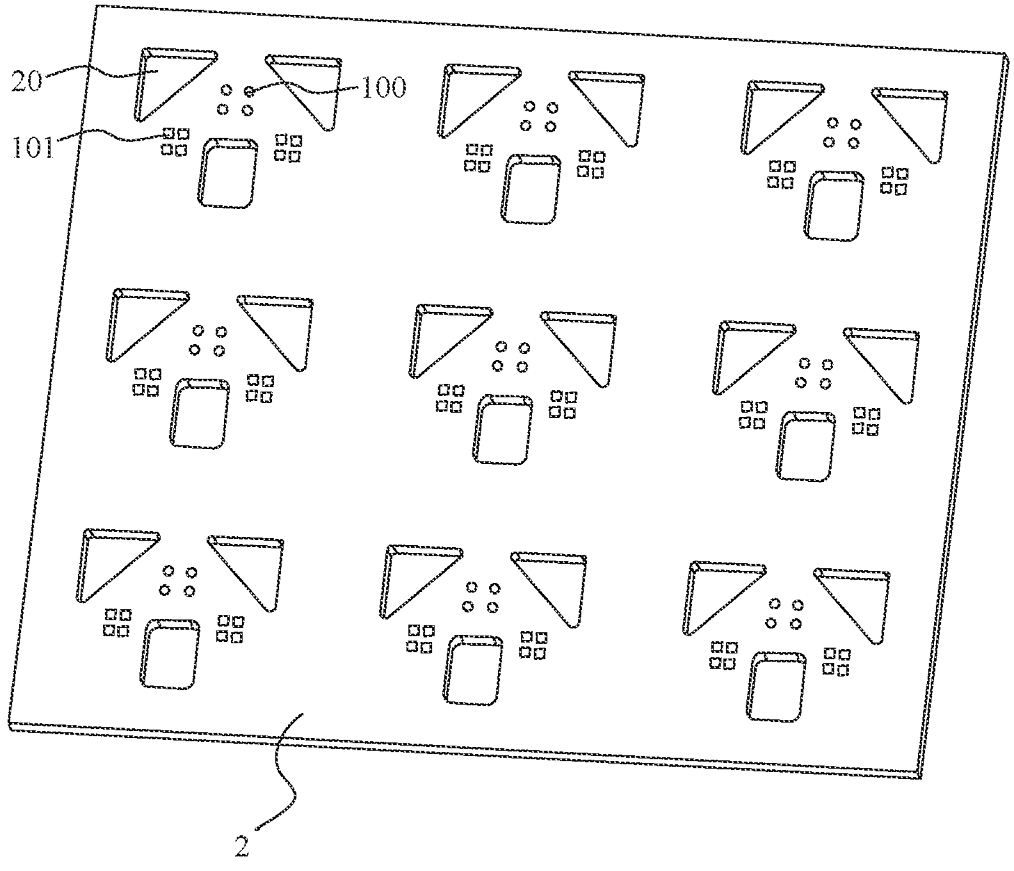
FIGS. 3(*a*)-3(*g*) are diagrams schematically showing steps of a method for fabricating a light-emitting image sensing module according to one embodiment of the present invention.
Figure 3B:
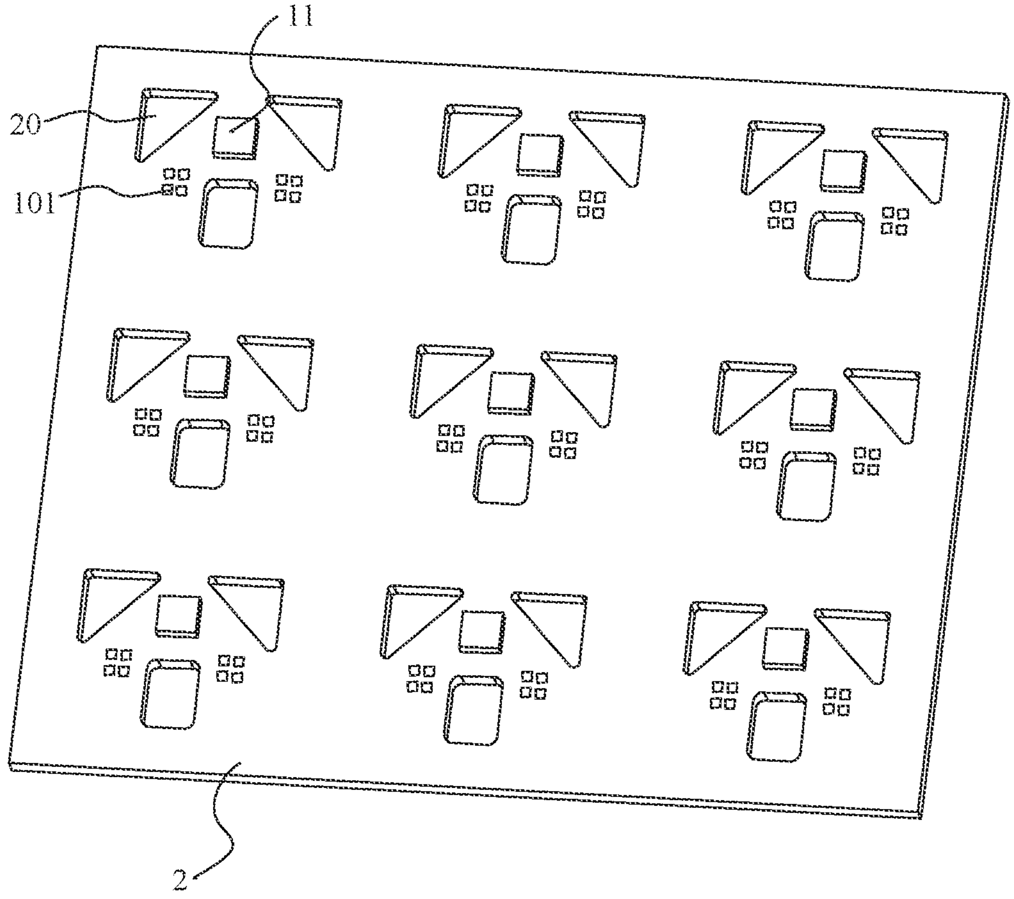
Figure 3C:
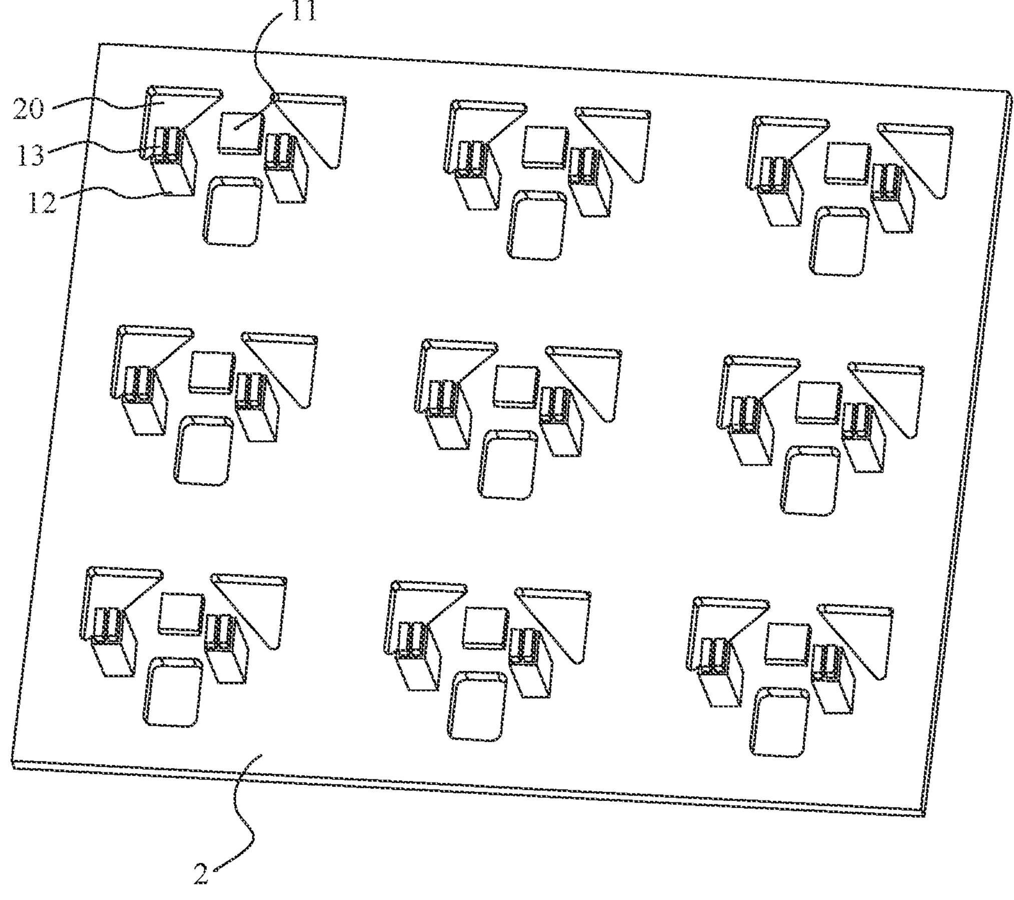
Figure 3D:
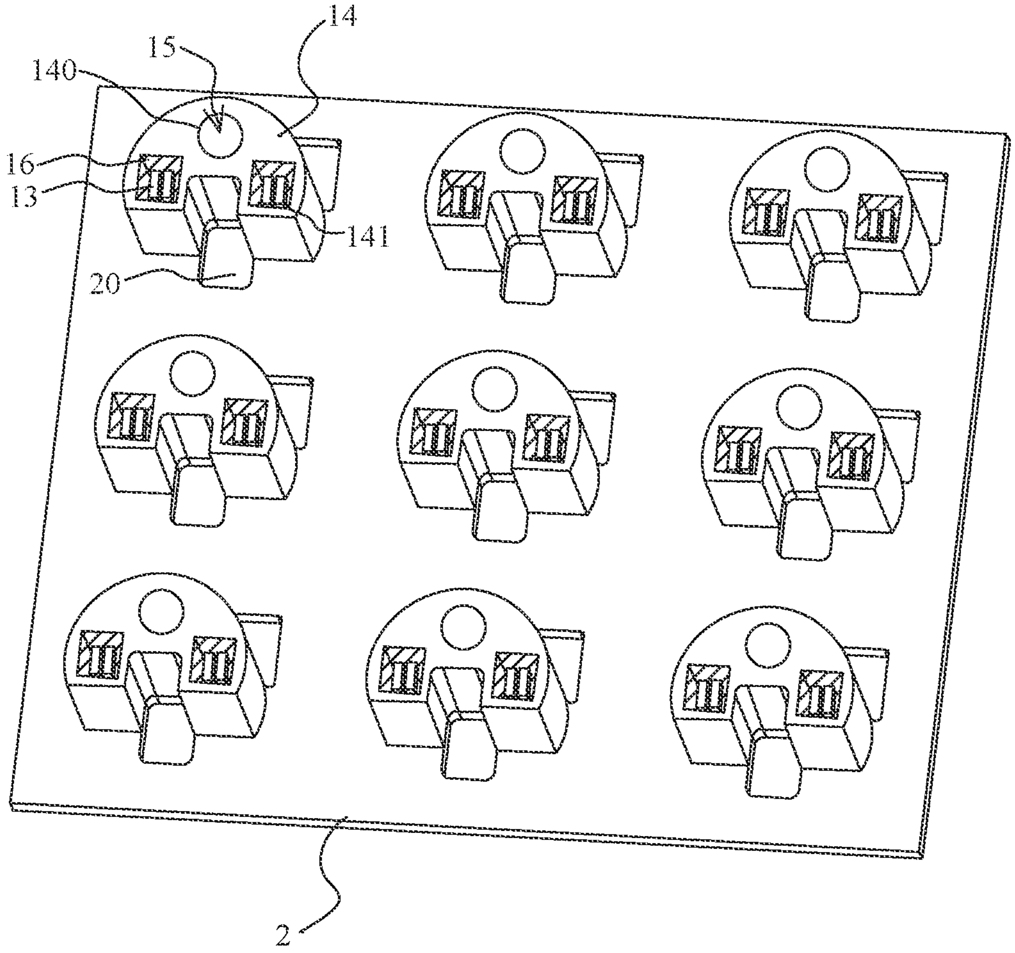
Figure 3E:
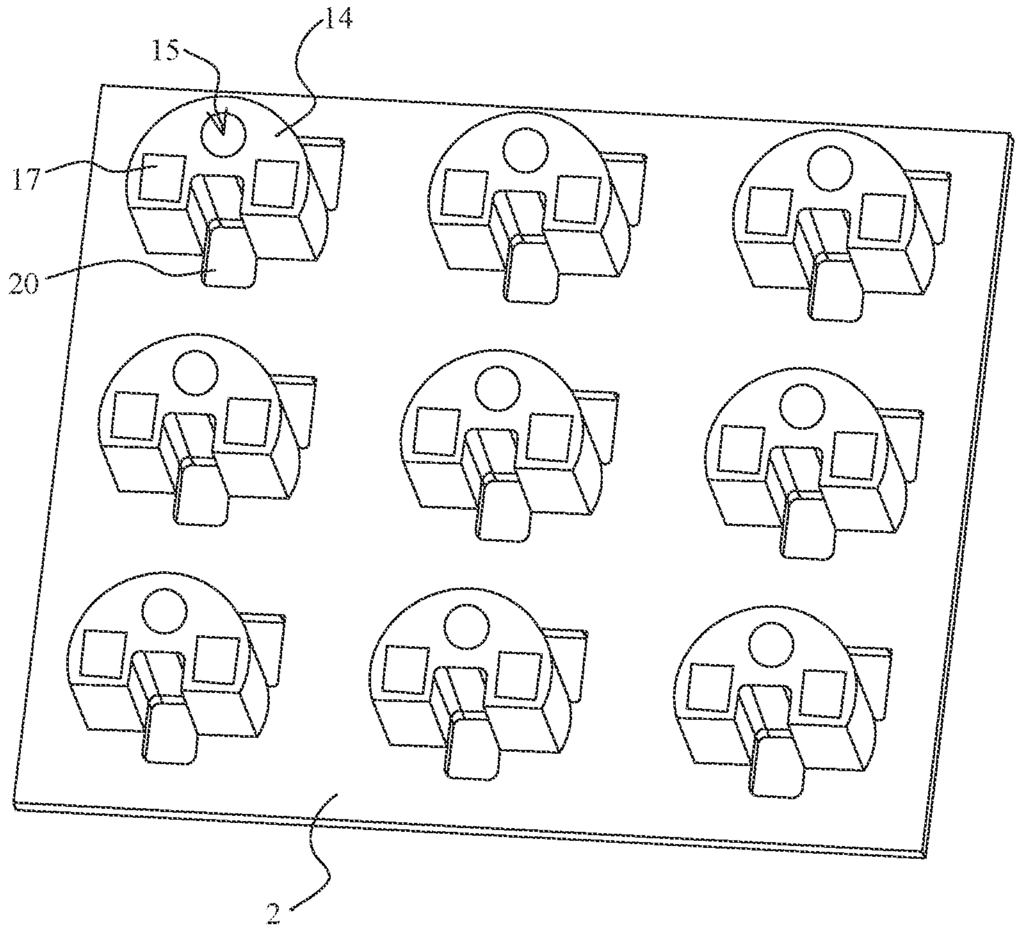
Figure 3F:
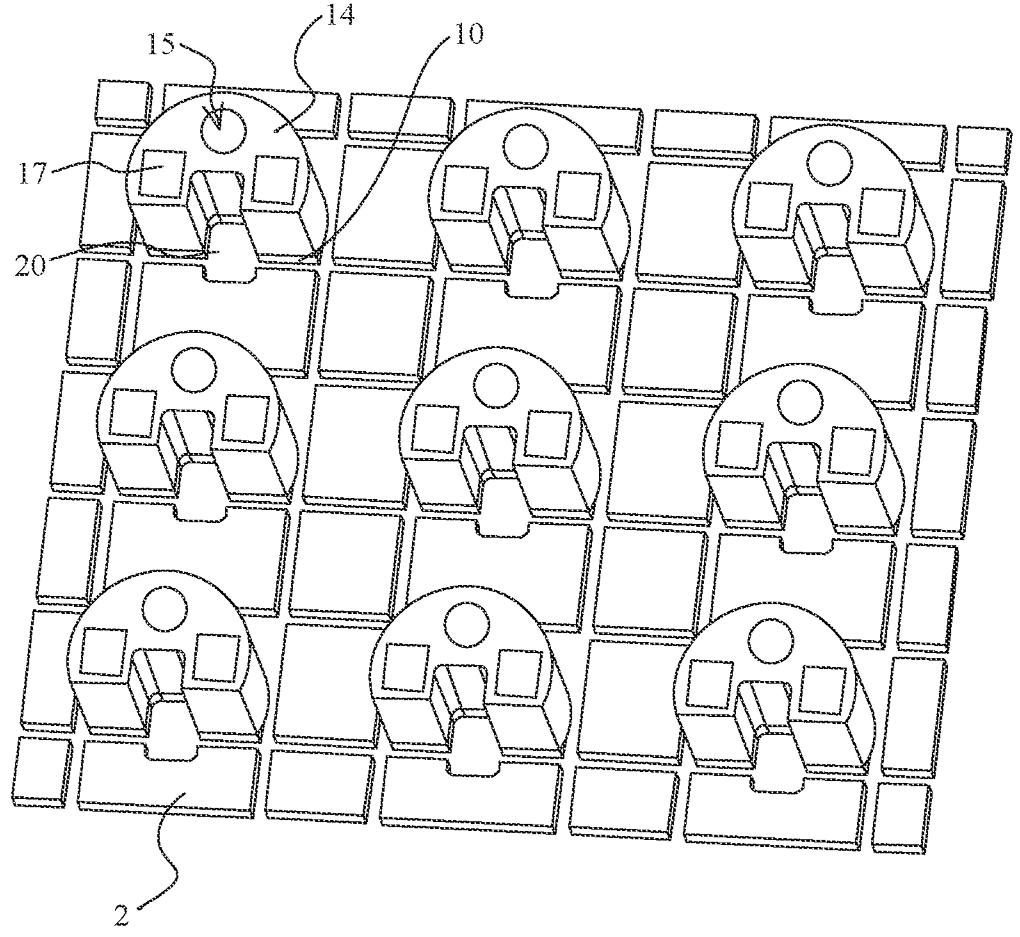
Figure 3G:
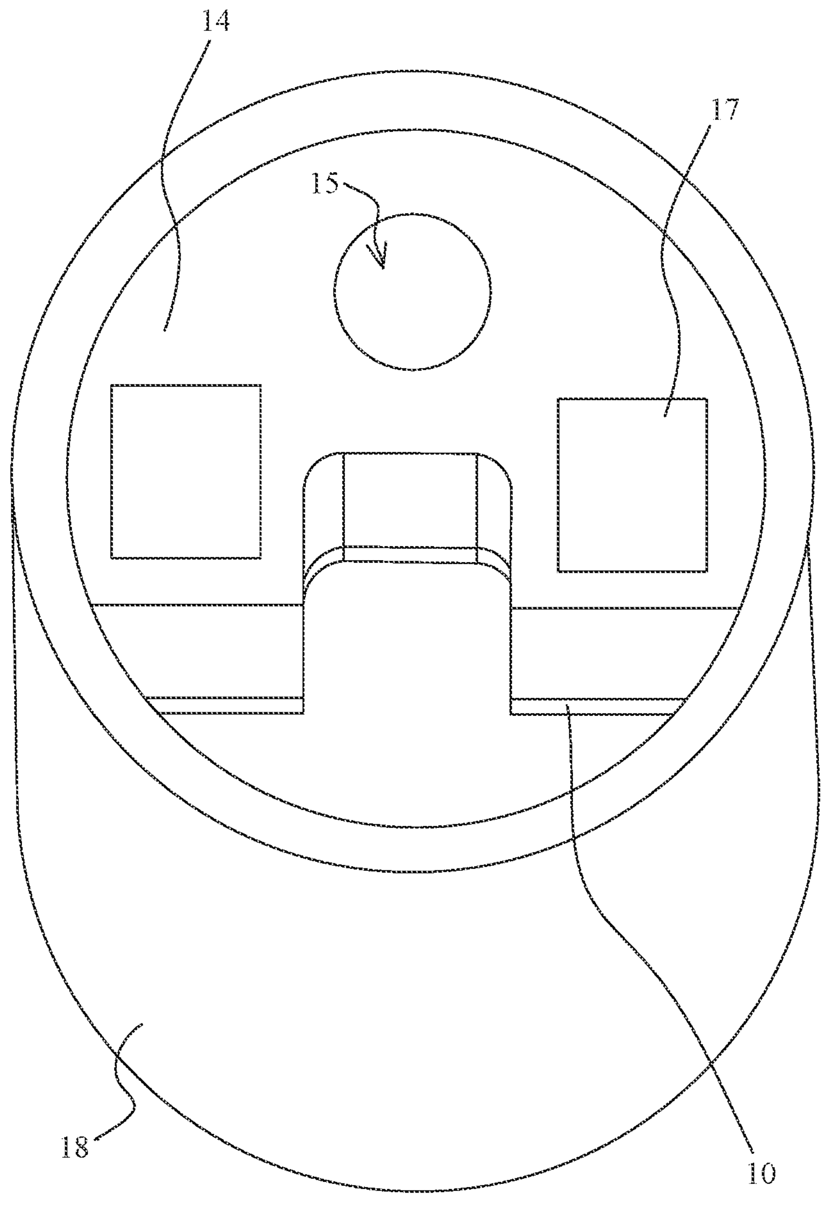
Figure 4A:
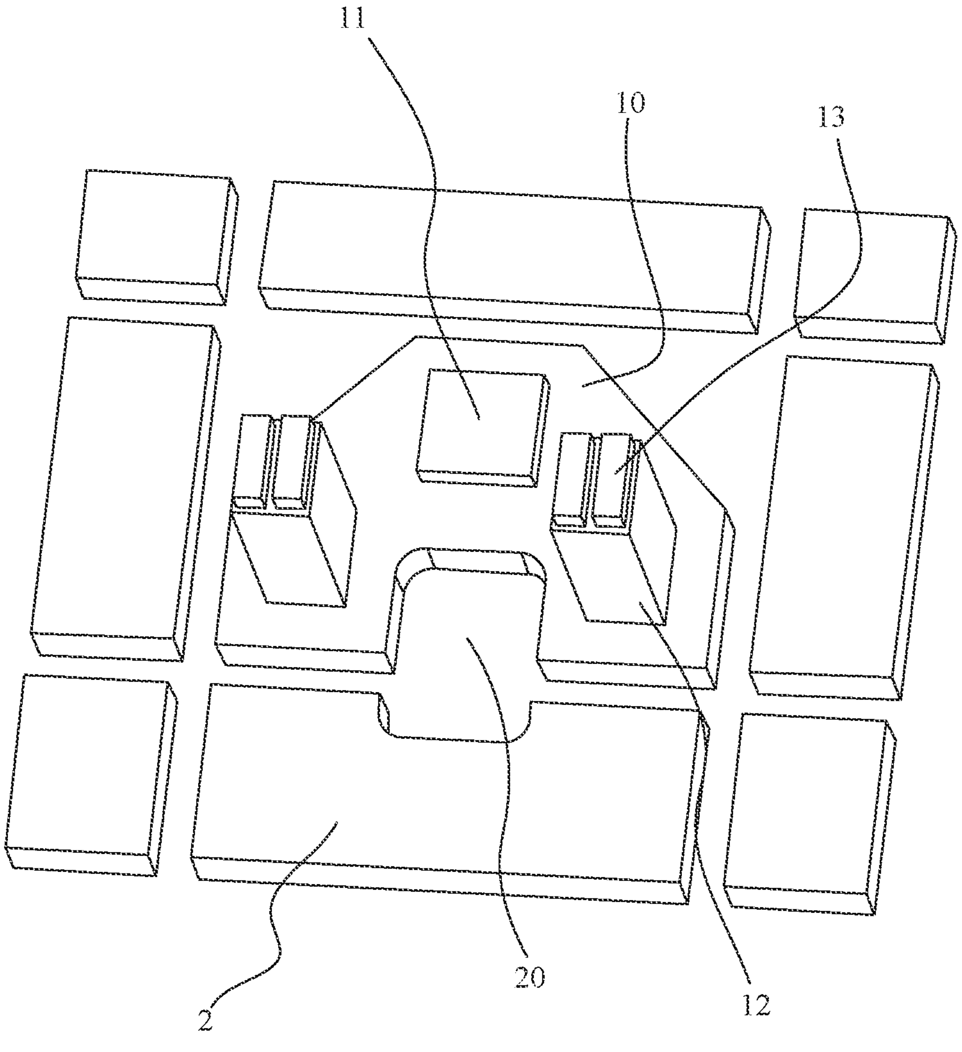
FIGS. 4(*a*)-4(*d*) are diagrams schematically showing steps of a method for fabricating a light-emitting image sensing module according to another embodiment of the present invention.
Figure 4B:
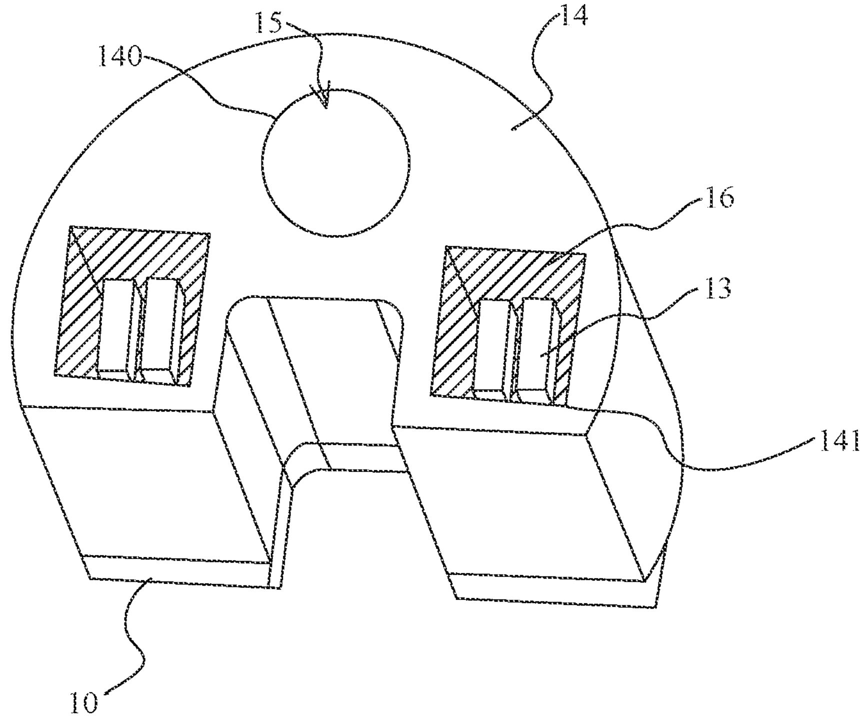
Figure 4C:
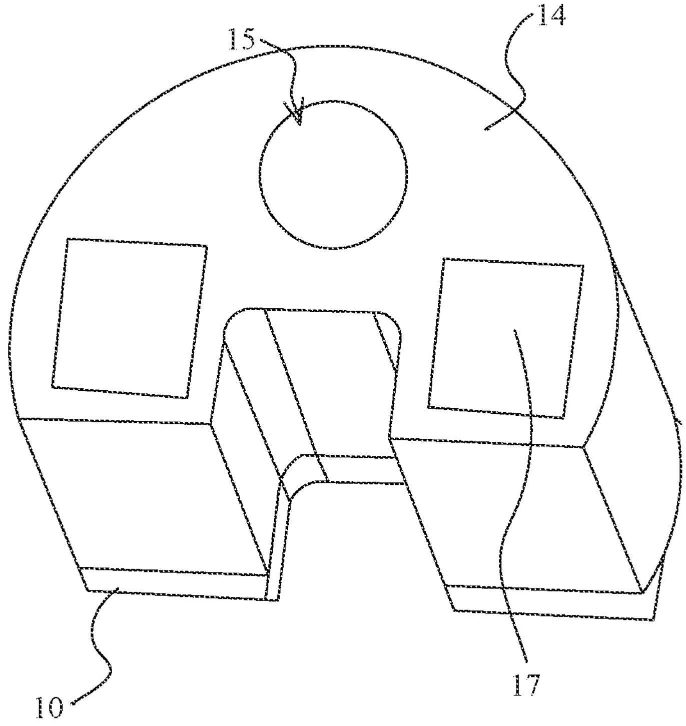
Figure 4D:
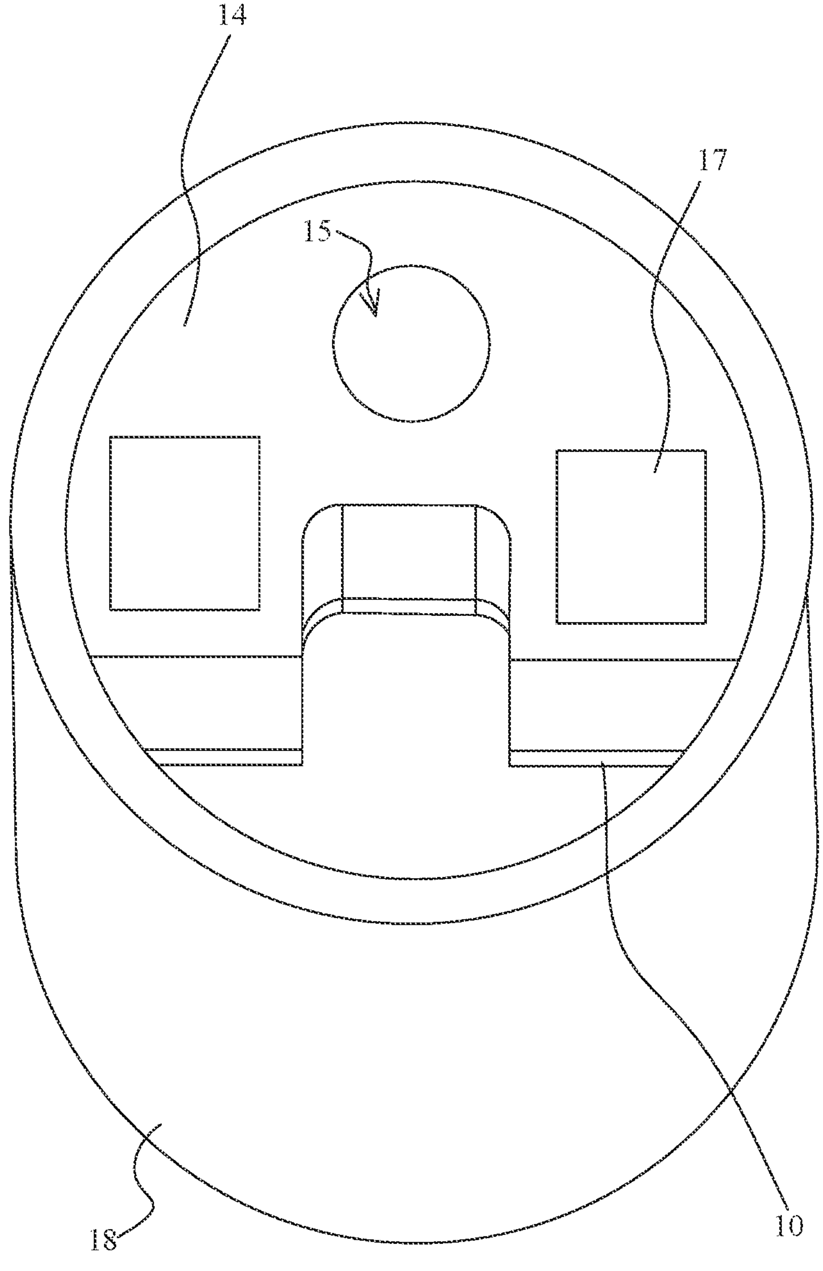

Refer to FIG. 1 and FIG. 2. FIG. 1 is a perspective view schematically showing the structure of a light-emitting image sensing module according to one embodiment of the present invention. FIG. 2 is an exploded view schematically showing the structure of a light-emitting image sensing module according to one embodiment of the present invention. The light-emitting image sensing module 1 of the present invention comprises a circuit board 10, an image sensor 11, at least one conductive carrier 12, at least one light source 13, an opaque lens barrel 14, and a lens module 15. In the embodiment shown in FIG. 2, two conductive carrier 12 and four light sources 13 are used. However, the present invention is not limited by the embodiment. The front side, the rear side and the middle of the circuit board 10 have sensing circuits 100 and light-emitting circuits 101.

The circuit board 10 may be but is not limited to be a ceramic substrate, a printed circuit board, or a flexible printed circuit board. The light sources 13 may be but is not limited to be light-emitting diodes (LEDs). The light sources 13 may be realized by the light-emitting diodes respectively emitting lights having different colors and different wavelengths, such as white light LEDs, blue light LEDs, green light LEDs, red light LEDs, and/or infrared LEDs, which may be switched according to requirement or turned on simultaneously for illumination and inspection. The image sensor 11 may be installed on the circuit board 10 and electrically connected with the sensing circuit 100 through the Ball Grid Array (BGA) technology. The conductive carrier 12 is installed on the circuit board 10 and electrically connected with the light-emitting circuit 101 of the circuit board 10. The height of the conductive carrier 12 may be simulated and designed in advance according to requirement. The position of the conductive carrier 12 is corresponding to the position of the image sensor 11. The light sources 13 are disposed on the top of the conductive carrier 12 and electrically connected with the conductive carrier 12. In the embodiment, two light sources 13 are disposed on the top of each conductive carrier 12. As the image sensor 11 and the light sources 13 are packaged on the same circuit board 10 simultaneously, the present invention can achieve the benefit of economical scale. A first hole 140 and at least one second hole 141 penetrate the opaque lens barrel 14. In the embodiment, two second holes 141 are used. However, the present invention is not limited by the embodiment. The positions of the first hole 140 and the second holes 141 are respectively corresponding to the positions of the image sensor 11 and the conductive carriers 12. The opaque lens barrel 14 may be installed on the circuit board 10 with glue, using the first hole 140 to sleeve the image sensor 11 and using the second holes 141 to sleeve the conductive carriers 12 and the light sources 13. In the embodiment, each second hole 141 sleeves one conductive carrier 12 and two light sources 13 on the conductive carrier 12. The opaque lens barrel 14 sleeves the image sensor 11 and the light sources 13 simultaneously. Such a design can reduce the area used by the conventional wherein the traditional barrel sleeves the image sensor and then the light sources are added to the traditional barrel. Therefore, the present invention is more suitable to be used by smaller-size endoscopes than the traditional products. The opaque lens barrels 14 may be mass-produced in a mold-injection technology, enjoying cost advantage and having higher yield and better fabrication flexibility than the fabrication of the wafer-level lenses. The lens module 15 may be fixed in the first hole 140 and disposed above the image sensor 11 with glue.

In some embodiments of the present invention, a reflecting film 16 is formed on the inner sidewall of the second holes 141 to concentrate the light sources. The light-emitting image sensing module 1 further comprises at least one transparent resin 17. The transparent resin 17 is filled into the second hole 141 to cover the corresponding conductive carrier 12 and light source 13. Thus, the second hole 141 becomes a column-like light conduction structure able to increase light utilization efficiency. Because the opaque material of the opaque lens barrel 14 can prevent the light of the light source 13 from entering the first hole 140, stray light will not appear in the first hole 140.

The lens module 15 may include at least one lens, at least one spacer and a transparent cover plate. For example, the lens module 15 includes a lens 150, a spacer 151, a lens 152, a spacer 153, and a transparent cover plate 154. The lens 150 may be fixed in the first hole 140 with glue and is disposed above the image sensor 11. The spacer 151 is fixed in the first hole 140 and disposed on the lens 150. The center of the spacer 151 has a through-hole 1510, which penetrates the spacer 151 and allows images to pass. The lens 152 is fixed in the first hole 140 and disposed on the spacer 151. The spacer 153 is fixed in the first hole 140 and disposed on the lens 152. The center of the spacer 153 has a through-hole 1530, which penetrates the spacer 153 and allows images to pass. The transparent cover plate 154 may be fixed in the first hole 140 with glue and is disposed on the spacer 153. The spacers 151 and 153 may guarantee the correctness of the gap between the lens 150 and the lens 152 and the gap between the lens 152 and the transparent cover plate 154. Modulation Transfer Function (MTF) inspection equipment is used to control the assemblage quality of the lens module 15, wherein an active alignment technology is used to learn the assemblage quality, and the relative position and angle of the lenses 150 and 152 is verified and adjusted instantly, whereby to guarantee the quality of products and raise the yield of the image sensing modules 1. In the fabrication of wafer-level lenses, it is unlikely to learn the quality of the lens modules and correct the problems in real time. Therefore, the lens module 15 is superior to the wafer-level lens in yield and cost. Besides, the combination of the lenses of the lens module 15 may be arbitrarily varied to obtain different optical specifications. Such a feature further increases the fabrication flexibility of the present invention.

The light-emitting image sensing module 1 may further comprises a hollow cylinder 18. The shape of the hollow cylinder 18 may match with the shape of the opaque lens barrel 14, such as a barrel shape. The hollow cylinder 18 may directly sleeve the opaque lens barrel 14, the circuit board 10, the image sensor 11, the concoctive carriers 12, the light sources 13, the lens module 15, and the transparent resin 17 to form an endoscope. Thus is saved following assemblage processes.

FIGS. 3(*a*)-3(*g*) are diagrams schematically showing steps of a method for fabricating a light-emitting image sensing module according to one embodiment of the present invention. Below is introduced an embodiment of a method for fabricating a light-emitting image sensing module. Refer to FIGS. 3(*a*)-3(*g*). As shown in FIG. 3(*a*), provide a motherboard 2, which has a plurality of groups of cutting holes 20 penetrating the motherboard 2, sensing circuits 100, and light-emitting circuits 101. As shown in FIG. 3(*b*), install a plurality of image sensors 11 on the motherboard 2 and electrically connect the image sensors 11 with the motherboard 2, wherein the positions of the plurality of groups of cutting holes 20 are respectively corresponding to the positions of the image sensors 11. As shown in FIG. 3(*c*), install a plurality of conductive carriers 12 on the motherboard 2 and electrically connect the conductive carriers 12 with the motherboard 2, wherein the positions of the conductive carriers 12 are respectively corresponding to the positions of the image sensors 11. In the embodiment, each image sensor 11 is corresponding to two conductive carriers 12. A plurality of light sources 13 is disposed on the top of each conductive carrier 12 and electrically connected with the conductive carrier 12. In the embodiment, each conductive carrier 12 is equipped with two light sources 13. As shown in FIG. 3(*d*), respectively provide a plurality of opaque lens barrels 14 for all the image sensors 11. Each opaque lens barrel 14 has a first hole 140 and at least one second hole 141, which penetrate the opaque lens barrel 14. In the embodiment, the opaque lens barrel 14 has two second holes 141. The positions of the first hole 140 and the second holes 141 are respectively corresponding to the positions of the image sensor 11 and the conductive carriers 12. A reflecting film 16 is formed on the inner sidewall of the second hole 141. Each opaque lens barrel 14 has one lens module 15 fixed there inside. As shown in FIG. 3(*c*), FIG. 3(*d*) and FIG. 3(*e*), install all the opaque lens barrels 14 on the motherboard 2, use the first holes 141 to sleeve the image sensors 11, and use the second holes 141 to sleeve the corresponding conductive carriers 12 and light sources 13, wherein the lens module 15 is disposed above the corresponding image sensor 11. As shown in FIG. 3(*d*) and FIG. 3(*e*), fill a transparent resin 17 into the second holes 141 of each opaque lens barrel 14 to cover the corresponding conductive carriers 12 and light sources 13. As shown in FIG. 3(*f*), cut the motherboard 2 along the cutting holes 20 to obtain a plurality of light-emitting image sensing modules, wherein each light-emitting image sensing module comprises a circuit board 10 and also comprises an image sensor 11, at least one conductive carrier 12, at least one light source 13, an opaque lens barrel 14 and a lens module 15, which are disposed on the circuit board 10. A step of FIG. 3(*g*) may be further undertaken after the step of FIG. 3(*f*). As shown in FIG. 3(*g*), use a hollow cylinder 18 to sleeve the circuit board 10 and the opaque lens barrel 14, the image sensor 11, the conductive carriers 12, the light sources 13, the lens module 15 and the transparent resin 17, which are disposed on the circuit board 10. As long as a substantially the same result can be obtained, it is not necessary to perform the abovementioned steps according to the order shown by FIGS. 3(*a*)-3(*g*).

FIGS. 4(*a*)-4(*d*) are diagrams schematically showing steps of a method for fabricating a light-emitting image sensing module according to another embodiment of the present invention. Below is introduced another embodiment of a method for fabricating a light-emitting image sensing module. Refer to FIGS. 4(*a*)-4(*d*). As shown in FIG. 4(*a*), install an image sensor 11 on a circuit board 10 and electrically connect the image sensor 11 with the circuit board 10, wherein the circuit board 10 may be obtained via cutting a motherboard 2 having a group of cutting holes 20; install at least one conductive carrier 12 on the circuit board 10 and electrically connect the conductive carrier 12 with the circuit board 10. In the embodiment, two conductive carriers 12 are used. In the same step shown in FIG. 4(*a*), install at least one light source 13 on the top of each conductive carrier 12 and electrically connect the light source 13 with the conductive carrier 12. As shown in FIG. 4(*b*), provide an opaque lens barrel 14, wherein the opaque lens barrel 14 has a first hole 140 and at least one second hole 141, which penetrate the opaque lens barrel 14. In the embodiment, two second holes 141 are used. The positions of the first hole 140 and the second holes 141 are respectively corresponding to the positions of the image sensor 11 and the conductive carriers 12. In the same step shown in FIG. 4(*b*), form a reflecting film 16 on the inner sidewall of the second hole 141; fix a lens module 15 in the first hole 140. In the same step shown in FIG. 4(*b*), install the opaque lens barrel 14 on the circuit board 10, use the first hole 140 to sleeve the image sensor 11, and use each second hole 141 to sleeve one conductive carrier 12 and one light source 13, wherein the lens module 15 is disposed above the image sensor 11. As shown in FIG. 4(*c*), fill a transparent resin 17 into the second hole 141 of the opaque lens barrel 14 to cover the corresponding conductive carrier 12 and the light source 13. A step of FIG. 4(*d*) may be further undertaken after the step of FIG. 4(*c*). As shown in FIG. 4(*d*), use a hollow cylinder 18 to sleeve and the opaque lens barrel 14, the circuit board 10, the image sensor 11, the conductive carriers 12, the light sources 13, the lens module 15 and the transparent resin 17. As long as a substantially same result can be obtained, it is not necessary to perform the abovementioned steps according to the order shown by FIGS. 4(*a*)-4(*d*).

In conclusion, the light-emitting image sensing module and the method for fabricating the same are suitable to fabricate smaller endoscopes and able to achieve the benefit of economical scale, raise yield and increase fabrication flexibility.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the appended claims.

What is claimed is:

1. A light-emitting image sensing module, comprising an installation circuit board;

an image sensor, installed on the installation circuit board and electrically connected with the installation circuit board;

at least one conductive wiring carrier, installed on the installation circuit board and electrically connected with the installation circuit board, wherein a position of the at least one conductive wiring carrier is corresponding to a position of the image sensor;

at least one light source, disposed on a top of the at least one conductive wiring carrier and electrically connected with the at least one conductive wiring carrier;

an opaque lens barrel, having a first hole and at least one second hole, wherein the first hole and the at least one second hole penetrate the opaque lens barrel; a position of the first hole and a position of the at least one second hole are respectively corresponding to a position of the image sensor and a position of the at least one conductive wiring carrier; the opaque lens barrel is installed on the installation circuit board; the first hole sleeves the image sensor, and the at least one second hole sleeves the at least one conductive wiring carrier and the at least one light source;

a lens module, fixed in the first hole and disposed above the image sensor; and a hollow cylinder, which sleeves the installation circuit board, the image sensor, the at least one conductive wiring carrier, the at least one light source, and the lens module.

2. The light-emitting image sensing module according to claim 1, wherein the at least one light source is a light-emitting diode.

3. The light-emitting image sensing module according to claim 1, wherein a reflecting film is formed on an inner sidewall of the at least one second hole.

4. The light-emitting image sensing module according to claim 1, further comprising a transparent resin, which is filled into the at least one second hole to cover the at least one conductive wiring carrier and the at least one light source.

5. The light-emitting image sensing module according to claim 1, wherein the lens module includes at least one lens, fixed in the first hole and disposed above the image sensor;

at least one spacer, fixed in the first hole, disposed on the at least one lens, and having a through-hole penetrating the at least one spacer; and a transparent cover plate, fixed in the first hole and disposed on the at least one spacer.

6. The light-emitting image sensing module according to claim 1, wherein the installation circuit board is a ceramic substrate, a printed circuit board, or a flexible printed circuit board.

7. A method for fabricating a light-emitting image sensing module, comprising steps:

providing a motherboard having a plurality of groups of cutting holes that penetrate the motherboard;

installing a plurality of image sensors on the motherboard, and electrically connecting the image sensors with the motherboard, wherein positions of the plurality of groups of cutting holes are respectively corresponding to positions of the plurality of image sensors;

installing a plurality of conductive wiring carriers on the motherboard, and electrically connecting the plurality of conductive wiring carriers with the motherboard, wherein positions of the plurality of conductive wiring carriers are respectively corresponding to the positions of the plurality of image sensors;

respectively installing a plurality of light sources on tops of the plurality of conductive wiring carriers, and respectively electrically connecting the plurality of light sources with the plurality of conductive wiring carriers;

providing a plurality of opaque lens barrels respectively corresponding to the plurality of image sensors, wherein each of the opaque lens barrels has a first hole and at least one second hole, which penetrate the opaque lens barrel, and wherein positions of the first hole and the at least one second hole are respectively corresponding to the positions of the image sensor and the conductive wiring carrier, and wherein a lens module is fixed in the first hole of each of the opaque lens barrels;

installing the plurality of opaque lens barrels on the motherboard, using the first holes to sleeve the plurality of image sensors, and using the second holes to sleeve the plurality of conductive wiring carriers and the plurality of light sources, wherein the lens module is disposed above the image sensor corresponding to the lens module; and cutting the motherboard along the plurality of groups of cutting holes to obtain a plurality of light-emitting image sensing modules, wherein each of the light-emitting image sensing modules includes an installation circuit board, and also includes the image sensor, the conductive wiring carrier, the light source, the lens module and the opaque lens barrel, which are disposed on the installation circuit board.

8. The method for fabricating a light-emitting image sensing module according to claim 7, further comprising a step: using a hollow cylinder to sleeve each of the installation circuit boards, and also sleeve the opaque lens barrel, the image sensor, the conductive wiring carrier, the light source, and the lens module, which are disposed on the installation circuit board.

9. The method for fabricating a light-emitting image sensing module according to claim 7, further comprising a step: filling a transparent resin into the at least one second hole of each of the opaque lens barrels to cover the conductive wiring carrier and the light source.

10. A method for fabricating a light-emitting image sensing module, comprising steps:

installing an image sensor on an installation circuit board, and electrically connecting the image sensor with the installation circuit board;

installing at least one conductive wiring carrier on the installation circuit board, and electrically connecting the at least one conductive wiring carrier with the installation circuit board;

installing at least one light source on a top of the at least one conductive wiring carrier, and electrically connecting the at least one light source with the at least one conductive wiring carrier;

providing an opaque lens barrel, wherein the opaque lens barrel has a first hole and at least one second hole, which penetrate the opaque lens barrel, and wherein positions of the first hole and the at least one second hole are respectively corresponding to positions of the image sensor and the at least one conductive wiring carrier, and fixing a lens module in the first hole of the opaque lens barrel; and installing the opaque lens barrel on the installation circuit board, using the first hole to sleeve the image sensor, and using the at least one second hole to sleeve the at least one conductive wiring carrier and the at least one light source, wherein the lens module is disposed above the image sensor.

11. The method for fabricating a light-emitting image sensing module according to claim 10, further comprising a step: using a hollow cylinder to sleeve the opaque lens barrel, the installation circuit board, the image sensor, the at least one conductive wiring carrier, the at least one light source, and the lens module.

12. The method for fabricating a light-emitting image sensing module according to claim 10, further comprising a step: filling a transparent resin into the at least one second hole to cover the at least one conductive wiring carrier and the at least one light source.

13. The method for fabricating a light-emitting image sensing module according to claim 10, wherein the installation circuit board is obtained via cutting a motherboard.

* * * * *